United States Patent
Jensen et al.

(10) Patent No.: US 9,940,708 B2
(45) Date of Patent: Apr. 10, 2018

(54) SYSTEMS AND METHODS FOR DOUBLE PULSED DIFFUSIONAL KURTOSIS IMAGING

(71) Applicant: MUSC Foundation for Research Development, Charleston, SC (US)

(72) Inventors: Jens Jensen, Charleston, SC (US); Sai Kam Hui, North Point (HK); Joseph Helpern, Sullivans Island, SC (US)

(73) Assignee: MUSC University of South Carolina, Charleston, SC (US)

( * ) Notice: Subject to any disclaimer, the term of this patent is extended or adjusted under 35 U.S.C. 154(b) by 539 days.

(21) Appl. No.: 14/618,345

(22) Filed: Feb. 10, 2015

(65) Prior Publication Data

US 2015/0228073 A1    Aug. 13, 2015

Related U.S. Application Data

(60) Provisional application No. 61/937,863, filed on Feb. 10, 2014.

(51) Int. Cl.
- *G01V 3/00* (2006.01)
- *G06T 7/00* (2017.01)
- *G01R 33/563* (2006.01)

(52) U.S. Cl.
CPC ...... *G06T 7/0012* (2013.01); *G01R 33/56341* (2013.01); *G06T 2207/10088* (2013.01); *G06T 2207/20076* (2013.01); *G06T 2207/30016* (2013.01)

(58) Field of Classification Search
CPC .......... G01V 3/32; G01V 3/38; G01N 24/081; G01R 33/448; G01R 33/3808

USPC ......................................................... 324/303
See application file for complete search history.

(56) References Cited

U.S. PATENT DOCUMENTS

| | | | |
|---|---|---|---|
| 2010/0033182 A1 | 2/2010 | Ozarslan et al. | |
| 2011/0052029 A1 | 3/2011 | Connah et al. | |
| 2012/0002851 A1* | 1/2012 | Jensen | G01R 33/56341 382/128 |
| 2014/0184220 A1* | 7/2014 | Paulsen | G01N 24/081 324/309 |

OTHER PUBLICATIONS

Poot, Dirk HJ, et al. "Optimal experimental design for diffusion kurtosis imaging." Medical Imaging, IEEE Transactions 29.3 (2010): 819-829.
International Search Report for PCT/US15/15185, dated May 20, 2015, pp. 1-10.

* cited by examiner

*Primary Examiner* — Walter L Lindsay, Jr.
*Assistant Examiner* — Frederick Wenderoth
(74) *Attorney, Agent, or Firm* — Tarolli, Sundheim, Covell & Tummino LLP

(57) ABSTRACT

One aspect of the present disclosure relates to a system that can perform double pulsed diffusional kurtosis imaging (DP-DKI). Image data can be received. The image data can be acquired using a double pulsed field gradient (d-PFG) diffusion sequence. A six dimensional (6D) diffusional kurtosis for the image data can be determined. A magnitude of the image data can be determined in terms of the 6D diffusional kurtosis. DP-DKI can isolate the contributions to the d-PFG diffusion sequence, which can represent leading diffusion effects, that cannot be seen from single pulsed field gradient (s-PFG) diffusion sequences.

20 Claims, 8 Drawing Sheets

SYSTEMS AND METHODS FOR DOUBLE PULSED DIFFUSIONAL KURTOSIS IMAGING

RELATED APPLICATIONS

This application claims the benefit of U.S. Provisional Application No. 61/937,863, filed Feb. 10, 2014, entitled "Double Pulsed Diffusional Kurtosis Imaging," the entirety of which is hereby incorporated by reference for all purposes.

TECHNICAL FIELD

The present disclosure relates generally to diffusional kurtosis imaging (DKI) and, more specifically, to systems and methods for double pulsed DKI (DP-DKI).

BACKGROUND

Water diffusion in many biological tissues, including brain, is non-Gaussian. This non-Gaussianity is conveniently quantified with diffusional kurtosis, which can be estimated with a diffusion magnetic resonance imaging (MRI) technique known as diffusional kurtosis imaging (DKI). The diffusional kurtosis can be used for characterizing tissue microstructure, providing information related to microscopic (e.g., intra-voxel) diffusional heterogeneity. Accordingly, DKI has been applied to the study of a variety of neurological diseases.

Standard DKI utilizes conventional single pulsed field gradient (s-PFG) diffusion sequences, which have a single diffusion wave vector, q, for each signal acquisition. Recently, there has been a growing interest in double pulsed field gradient (d-PFG) diffusion sequences, which have a pair of diffusion wave vectors, (q, q'), for each signal acquisition. Such d-PFG diffusion sequences (also referred to as double-wave-vector sequences) yield information beyond that available with s-PFG diffusion sequences. For example, d-PFG diffusion sequences can detect microscopic diffusional anisotropy even when the data from the s-PFG diffusion sequences is isotropic. However, despite the advantages of d-PFG diffusion sequences, these d-PFG diffusion sequences have not been applied to DKI.

SUMMARY

The present disclosure relates generally to diffusional kurtosis imaging (DKI) and, more specifically, to systems and methods for double pulsed DKI (DP-DKI). DP-DKI can extend traditional DKI, using single pulsed field gradient (s-PFG) diffusion sequences, to double pulsed field gradient (d-PFG) diffusion sequences. DP-DKI can reveal second order contributions can represent leading diffusion effects, which cannot be seen from data collected from imaging studies using s-PFG diffusion sequences.

In one aspect, the present disclosure can include a system that performs DP-DKI. The system can include a non-transitory memory storing computer-executable instructions. The system can also include a processor that executes the computer-executable instructions. Upon the execution of the computer executable instructions, image data can be received. The image data can be acquired using d-PFG diffusion sequence. A six dimensional (6D) diffusional kurtosis can be determined for the image data. A magnitude of the image data can be determined in terms of the 6D diffusional kurtosis.

In another aspect, the present disclosure can include a method for performing DKI. The method can include steps that can be performed by a system that includes a processor. The steps can include: receiving image data acquired using a d-PFG diffusion sequence, determining a 6D diffusional kurtosis of the image data, and determining a magnitude of the image data based on the 6D diffusional kurtosis.

In a further aspect, the present disclosure can include a method for diagnosing a medical condition in a subject. The method can include steps that can be performed by a system that includes a processor. The steps can include: receiving image data acquired using a double pulsed field gradient (d-PFG) diffusion sequence of the subject undergoing a magnetic resonance imaging (MRI) procedure; determining a magnitude of the image data in terms of a 6D diffusional kurtosis; and diagnosing the medical condition of the subject based on the magnitude of the image data.

BRIEF DESCRIPTION OF THE DRAWINGS

The foregoing and other features of the present disclosure will become apparent to those skilled in the art to which the present disclosure relates upon reading the following description with reference to the accompanying drawings, in which.

DETAILED DESCRIPTION

I. Definitions

Figure 1:
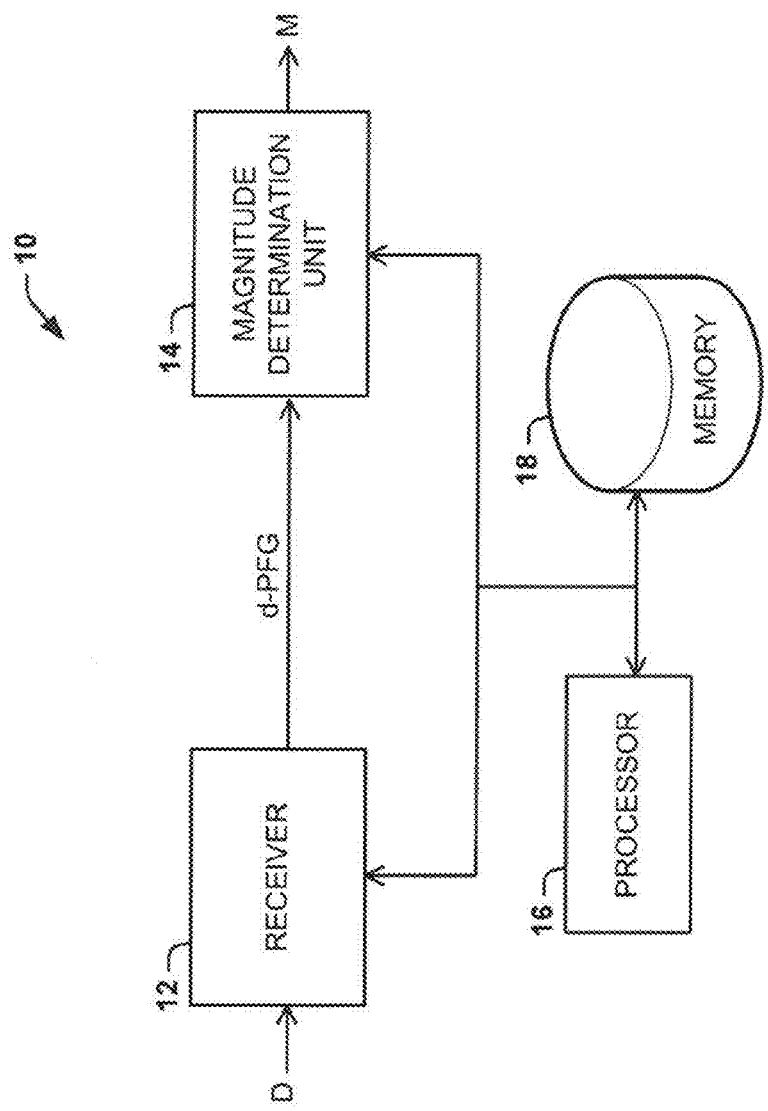
FIG. 1 is a schematic block diagram showing a system that can perform double pulsed diffusional kurtosis imaging (DP-DKI) in accordance with an aspect of the present disclosure.

In the context of the present disclosure, the singular forms "a," "an" and "the" can also include the plural forms, unless the context clearly indicates otherwise. The terms "comprises" and/or "comprising," as used herein, can specify the presence of stated features, steps, operations, elements, and/or components, but do not preclude the presence or addition of one or more other features, steps, operations, elements, components, and/or groups. As used herein, the term "and/or" can include any and all combinations of one or more of the associated listed items. Additionally, although the terms "first," "second," etc. may be used herein to describe various elements, these elements should not be limited by these terms. These terms are only used to distinguish one element from another. Thus, a "first" element discussed below could also be termed a "second" element without departing from the teachings of the present disclosure. The sequence of operations (or acts/steps) is not limited to the order presented in the claims or figures unless specifically indicated otherwise.

As used herein, the term "diffusion magnetic resonance imaging (dMRI)" can refer to a magnetic resonance imaging method that measures the diffusion of water molecules in biological tissues. The dMRI techniques allow for the diffusion to be measured both in vivo and non-invasively. For example, diffusion patterns of water molecules can reveal microscopic details about tissue architecture (e.g., information about a disease state). The diffusion anisotropy of water in biological tissues can be quantified with the diffusion tensor (DT), which can describe the diffusion displacement probability using a Gaussian distribution function. As used herein, the term "DT imaging (DTI)" can refer to a dMRI technique that uses a Gaussian approximation for the displacement probability distribution governing the random displacement of water molecules. However, in biological tissue, the displacement probability distribution can deviate considerably from the Gaussian form.

As used herein, the term "diffusional kurtosis" can refer to a quantitative measure of the degree to which the displacement probability distribution deviates from the Gaussian form.

As used herein, the term "diffusional kurtosis imaging (DKI) can refer to a MRI technique (e.g., dMRI) that is an extension of DTI, which can measure the diffusional kurtosis, which can be used to characterize tissue microstructure, which can provide information related to microscopic (e.g., intra-voxel) diffusional heterogeneity. In some instances, DKI can be been applied to the study of a variety of neurological diseases, and neuro-degenerative diseases. Examples of such neurological diseases and neuro-degenerative diseases can include stroke, Alzheimer's disease, head trauma, schizophrenia, attention deficit hyperactivity disorder, etc.

As used herein, the term "pulsed field gradient (PFG)" can refer to a diffusion gradient (e.g., due to a short, timed pulse with spatial-dependent field intensity) that can be used in DKI. Data from such PFG studies can be referred to as "single pulsed field gradient (s-PFG) diffusion sequences." Such s-PFG diffusion sequences can include a single diffusion wave vector, q, for each signal acquisition. Images from a PFG DKI using s-PFG diffusion sequences can be used, for example, to measure diffusion in biological tissues (e.g., neurological tissues), which can be used to characterize the microstructure of the biological tissues.

As used herein, the terms "double pulsed field gradient (d-PFG)" or "double-wave-vector sequences" can refer to multiple pairs diffusion gradients (e.g., due to short, timed pulses with spatial-dependent field intensity) that can be used in dMRI. Data from such d-PFG studies can be referred to as "d-PFG diffusion sequences." Such d-PFG diffusion sequences can have a pair of diffusion wave vectors, (q, q'), for each signal acquisition. For example, d-PFG diffusion sequences can be used in diffusional kurtosis to characterize tissue microstructure more completely than s-PFG diffusion sequences because d-PFG diffusion sequences reveal information beyond that available with s-PFG diffusion sequences (e.g., d-PFG diffusion sequences can detect microscopic diffusional anisotropy even when the data from the s-PFG diffusion sequences is isotropic).

As used herein, the term "double pulsed diffusional kurtosis imaging (DP-DKI)" can refer to an extension of traditional DKI to double pulsed field gradient (d-PFG) diffusion sequences. For example, DP-DKI can use a six dimensional (6D) formulation to extend DKI to d-PFG diffusion sequences.

As used herein, the term "b-value" can refer to a factor of diffusion weighted sequences identifying the measurement's sensitivity to diffusion and determines the strength and duration of the diffusion gradients. In some instances, the b-value can summarize the influence of the diffusion gradients on the corresponding diffusion weighted images. For example, the higher the b-value, the stronger the diffusion weighting.

As used herein, the term "subject" can refer to any warm-blooded organism including, but not limited to, a human being, a pig, a rat, a mouse, a dog, a cat, a goat, a sheep, a horse, a monkey, an ape, a rabbit, a cow, etc. The terms "subject" and "patient" can be used interchangeably herein.

II. Overview

The present disclosure relates generally to diffusional kurtosis imaging (DKI). DKI can be particularly appropriate for double pulsed field gradient (d-PFG) diffusion sequences at least because DKI can isolate the contributions to the d-PFG diffusion sequences that can be quantified to the second order in the diffusion weighting (b-value). Accordingly, the present disclosure relates, more specifically, to systems and methods for double pulsed DKI (DP-DKI) that extend DKI to d-PFG diffusion sequences.

DP-DKI can extend DKI to d-PFG diffusion sequences by using a six dimensional (6D) formulation for q-space. In the 6D formulation, the wave vector pair of the d-PFG diffusion sequences, (q,q'), can be represented as a single six-dimensional (6D) wave vector $\tilde{q}$. The first three components of $\tilde{q}$ can correspond to q and the second three components of $\tilde{q}$ can correspond to q'. Accordingly, the contributions to the d-PFG diffusion sequences can be quantified to second order in the diffusion weighting (b-value) in terms of the 6D diffusional kurtosis. In some instances, the contributions can also be quantified in terms of the 6D diffusivity. These second order contributions can represent leading diffusion effects, which cannot be seen from single PFG (s-PFG) diffusion sequences of traditional DKI.

III. Systems

One aspect of the present disclosure can include a system that can perform double pulsed diffusional kurtosis imaging (DP-DKI). DP-DKI can extend diffusional kurtosis imaging (DKI) to double pulsed field gradient (d-PFG) diffusion magnetic resonance imaging (dMRI) sequences (d-PFG diffusion sequences). The system can provide a practical approach for acquiring and analyzing data associated with the d-PFG diffusion sequences. The system can interpret the leading d-PFG effects in terms of the kurtosis for a diffusion displacement probability density function (dPDF) in a six-dimensional (6D) space. The 6D diffusional kurtosis can encode the unique information provided by the d-PFG diffusion sequences up to second order in the b-value, which can lead to a compact expression for the signal magnitude.

Figure 3:
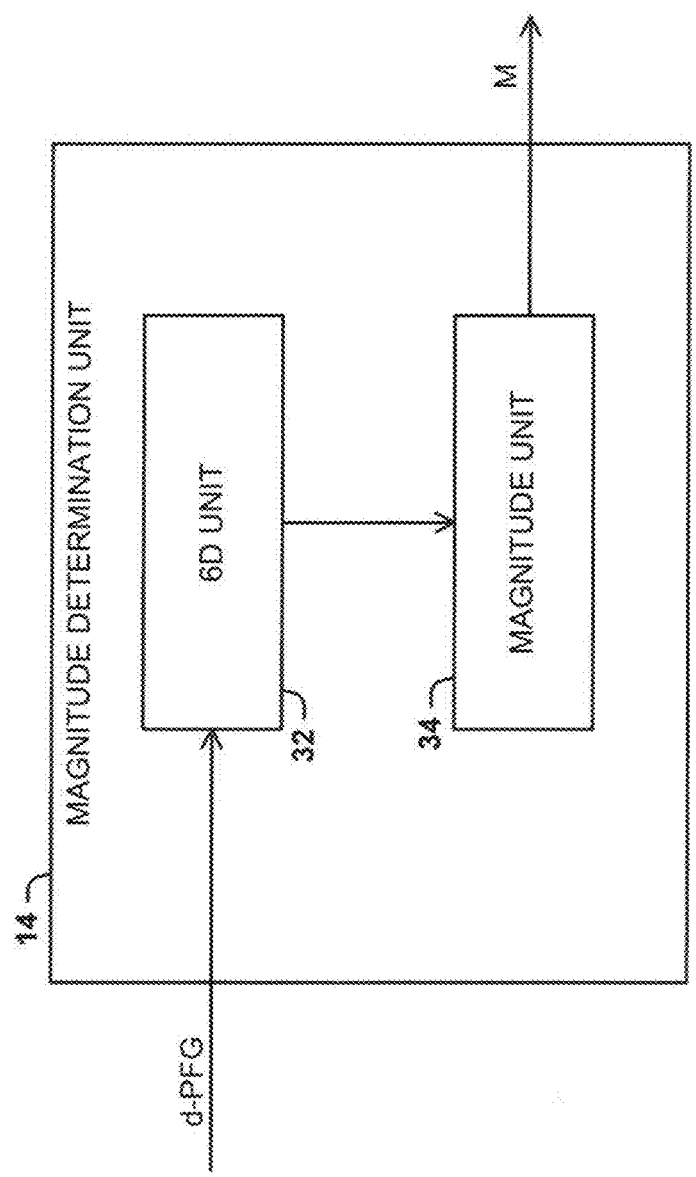
FIG. 3 is a schematic block diagram showing a magnitude determination unit that can be part of the system shown in FIG. 1.

FIG. 1 illustrates an example of a system 10 that perform DP-DKI, according to an aspect of the present disclosure. FIG. 1, as well as associated FIG. 3, is schematically illustrated as block diagrams with the different blocks representing different components. The functions of one or more of the components can be implemented by computer program instructions. These computer program instructions can be provided to a processor of a general purpose computer, special purpose computer, and/or other programmable data processing apparatus to produce a machine, such that the instructions, which execute via the processor of the computer and/or other programmable data processing apparatus, create a mechanism for implementing the functions of the components specified in the block diagrams.

These computer program instructions can also be stored in a non-transitory computer-readable memory that can direct a computer or other programmable data processing apparatus to function in a particular manner, such that the instructions stored in the non-transitory computer-readable memory produce an article of manufacture including instructions, which implement the function specified in the block diagrams and associated description.

The computer program instructions can also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions of the components specified in the block diagrams and the associated description.

Accordingly, the system 10 described herein can be embodied at least in part in hardware and/or in software (including firmware, resident software, micro-code, etc.). Furthermore, aspects of the system 10 can take the form of a computer program product on a computer-usable or computer-readable storage medium having computer-usable or computer-readable program code embodied in the medium for use by or in connection with an instruction execution system. A computer-usable or computer-readable medium can be any non-transitory medium that is not a transitory signal and can contain or store the program for use by or in connection with the instruction or execution of a system, apparatus, or device. The computer-usable or computer-readable medium can be, for example but not limited to, an electronic, magnetic, optical, electromagnetic, infrared, or semiconductor system, apparatus or device. More specific examples (a non-exhaustive list) of the computer-readable medium can include the following: a portable computer diskette; a random access memory; a read-only memory; an erasable programmable read-only memory (or Flash memory); and a portable compact disc read-only memory.

As shown in FIG. 1, one aspect of the present disclosure can include a system 10 configured to perform DP-DKI. As noted above, DP-DKI can extend DKI to d-PFG diffusion sequences, interpreting the leading d-PFG effects in terms of the kurtosis for a diffusion displacement probability density function (dPDF) in a six-dimensional (6D) space, which can lead to a compact expression for the signal magnitude. In one example, the system 10 can be utilized to aid in the diagnosis of a medical condition in a patient undergoing a dMRI procedure and/or imaging study. In some instances, the medical condition can be a neurological disease and/or a neuro-degenerative disease (e.g., stroke, Alzheimer's disease, head trauma, schizophrenia, attention deficit hyperactivity disorder, etc.).

The system 10 can include components including at least a receiver 12 and a magnitude determination unit 14. One or more of the components can include instructions that are stored in a non-transitory memory 18 and executed by a processor 16. Each of the components can be in a communicative relationship with one or more of the other components, the processor 16, and/or the non-transitory memory 18 (e.g., via a direct or indirect electrical, electromagnetic, optical, or other type of wired or wireless communication) such that an action from the respective component causes an effect on the other component.

The receiver 12 can be configured to receive a data (D) input. For example, the data (D) input can correspond to dMRI images using a d-PFG diffusion sequence. The data (D) input can include raw signals obtained from or generated by the dMRI modality (e.g., including noise or other contaminant). For example, the raw signals of the data (D) input can include a plurality of dMRI images. The dMRI images can include a d-PFG diffusion sequence.

Figure 2:
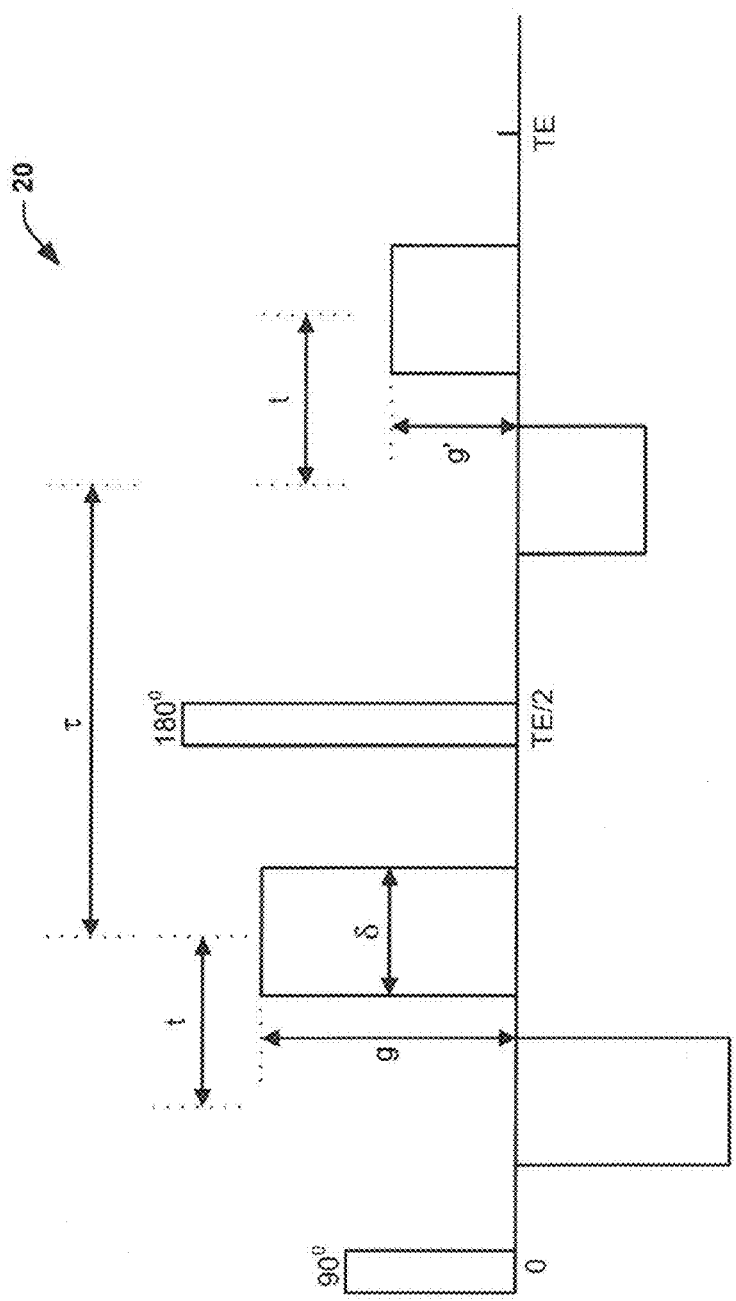
FIG. 2 is a schematic illustration showing a representative double pulsed field gradient (d-PFG) diffusion sequence that can be part of the data input into the system shown in FIG. 1.

The d-PFG diffusion sequence can have two blocks of diffusion gradients. An example d-PFG diffusion sequence 20 is shown in FIG. 2. The example d-PFG diffusion sequence 20 can correspond to a single spin echo sequence having a 180° refocusing pulse at half the echo time (TE). A first block of diffusion sensitizing gradient field pulses can occur prior to the refocusing pulse and a second block can occur after the refocusing pulse. The magnitude (g) of the first block of gradient field pulses may differ from the magnitude (g') of the second block. The diffusion wave vectors for the two blocks may also differ, with the concatenation of these two vectors yielding the 6D wave vector q̃. The diffusion times (t) for the two blocks can be the same. Additionally, the gradient pulse durations δ can be the same. The mixing time τ can be the interval from the center of the second lobe of the first block to the center of the first lobe of the second block.

Referring again to FIG. 1, the d-PFG diffusion sequence used to acquire the dMRI images can have a relatively long TE, which can result in a low signal-to-noise ratio. Accordingly, the receiver 12 can perform one or more noise removal procedure to increase the signal to noise ratio in the d-PFG data. Additionally, the data acquisition can be adjusted to keep the image acquisition time to a minimum, while allowing for better signal averaging. For example, the dMRI can include stronger gradients and accelerated acquisitions. In some instances, the data (D) input can reflect 15 or more gradient directions. In other instances, the data (D) input can reflect 18 or more gradient directions. In still other instances, the data (D) input can reflect 21 or more gradient directions.

The receiver 12 can provide the pre-processed d-PFG data to the magnitude determination unit 14. The magnitude determination unit 14 can determine a magnitude of the data representing the d-PFG diffusion sequence in terms of a six dimensional (6D) diffusional kurtosis (e.g., based on a diffusion displacement probability density function (dPDF)). The 6D diffusional kurtosis can encode information provided by the d-PFG diffusion sequence as a second order diffusion weighting (b-value). The contributions to the d-PFG diffusion sequence that are second order in the b-value can represent leading diffusion aspects that provide information beyond that which is available from a s-PFG diffusion sequence. The magnitude determination unit 14 can output a signal that includes the magnitude (M).

An example configuration of the magnitude determination unit 14 is shown in FIG. 3. The d-PFG signal can be input to the 6D unit 32 and the magnitude (M) can be determined by the magnitude unit 34. An example operation of the magnitude determination unit 14, taken with respect to the example d-PFG diffusion sequence of FIG. 2, is described and derived as follows.

The d-PFG MRI sequence of FIG. 2 includes a spin echo sequence with a first block of diffusion sensitizing gradients before the 180° refocusing pulse and a second block of diffusion sensitizing gradients after the 180° refocusing pulse. The diffusion time for each set of gradients is t, and the pulse durations are δ. The interval between the blocks is characterized by a mixing time τ. The first block has a gradient magnitude g, while the second block has a gradient magnitude g'. The b-values for the first and second blocks are $b \equiv (\gamma \delta g)^2 (t-\delta/3)$ and $b' \equiv (\gamma \delta g')^2 (t-\delta/3)$, respectively, where γ is the proton gyromagnetic ratio. To accommodate the two gradient blocks, the echo time TE must satisfy the condition TE ≥ 2t+δ+τ.

Referring again to FIG. 3, the 6D unit 32 can let the diffusion gradient direction of the first block be n, and the diffusion gradient direction of the second block be n'. Here, n and n' are standard three-dimensional (3D) vectors normalized to unit magnitude. The 3D diffusion wave vectors are then q≡γδgn/2π, for the first block, and q'≡γδg'n'/2π, for the second block. The 6D diffusion wave vector is defined as $\tilde{q} \equiv (q,q')$ and a corresponding 6D gradient direction vector, determined by the 6D unit 32, is defined by $\tilde{n} \equiv \tilde{q}/\tilde{q}$, where $\tilde{q} = |\tilde{q}|$ so that $|\tilde{n}|=1$. The 6D b-value is then given by $\tilde{b} = (2\pi\tilde{q})^2 (t-\delta/3) = b+b'$. For a fixed set of sequence timings, the gradient magnitudes and directions are completely specified by the 6D direction vector ñ and the b-value $\tilde{b}$.

Now the 6D unit 32 can consider the d-PFG signal magnitude $\tilde{S}(\tilde{b},\tilde{n})$ obtained with the sequence of FIG. 2. The logarithm of this signal can be expanded in powers of the 6D b-value as:

$$\ln[\tilde{S}(\tilde{b},\tilde{n})] = \ln(\tilde{S}_0) - \tilde{b}\tilde{D}_{app}(\tilde{n}) + \frac{1}{6}[\tilde{b}\tilde{D}_{app}(\tilde{n})]^2 \tilde{K}_{app}(\tilde{n}) + O(\tilde{b}^3), \quad \text{Equation 1}$$

which serves to define the apparent 6D diffusivity, $\tilde{D}_{app}(\tilde{n})$, and the apparent 6D diffusional kurtosis, $\tilde{K}_{app}(\tilde{n})$, for the direction ñ. The magnitude unit 34 can use Equation 1 to determine the magnitude of the data representing the d-PFG diffusion sequence as follows. The quantity $\tilde{S}_0 \equiv \tilde{S}(0,\tilde{n})$ is the signal magnitude without diffusion weighting. Equation 1 forms the basis of DP-DKI by generalizing to d-PFG sequences the standard DKI relationship between the diffusion weighted signal and the apparent diffusional kurtosis.

Similar to standard DKI, there are rigorous connections for DP-DKI between the apparent 6D diffusivity and diffusional kurtosis determined by Equation 1 and diffusion metrics defined in terms of the diffusion displacement probability density function (dPDF), which hold in the limit of short gradient pulse durations. For d-PFG sequences, the relevant dPDF is the joint probability density $\tilde{P}(s,s',t,\tau)$ of diffusion displacement s over a time interval t followed by a second displacement s' over a second interval of the same duration, with a mixing time τ separating the end of the first interval from the beginning of the second interval. By defining a 6D displacement $\tilde{s} \equiv (s,s')$, the dPDF can be written as $\tilde{P}(\tilde{s},t,\tau)$. The average of any function F(ŝ) may then be expressed as:

$$\langle F(\tilde{s}) \rangle = \int d^6\tilde{s} \tilde{P}(\tilde{s},t,\tau) F(\tilde{s}) \quad \text{Equation 2}$$

with the angle brackets being introduced as a shorthand for averaging over the dPDF. The 6D diffusivity for a direction ñ is given by:

$$\tilde{D}(\tilde{n}) = \frac{1}{2t}\langle(\tilde{s}\cdot\tilde{n})^2\rangle, \quad \text{Equation 3}$$

while the corresponding 6D diffusional kurtosis is given by $$\tilde{K}(\tilde{n}) = \frac{\langle(\tilde{s}\cdot\tilde{n})^4\rangle}{\langle(\tilde{s}\cdot\tilde{n})^2\rangle^2} - 3. \quad \text{Equation 4}$$

The expressions of Equations 3 and 4 are direct analogues of the standard 3D definitions. These definitions assume the no net flow condition of $\langle\tilde{s}\rangle=0$. In the limit that the pulse duration δ approaches zero:

$$\tilde{D}_{app}(\tilde{n}) \rightarrow \tilde{D}(\tilde{n}) \text{ and } \tilde{K}_{app}(\tilde{n}) \rightarrow \tilde{K}(\tilde{n}) \quad \text{Equation 5}$$

Proof of these statements is a straightforward generalization of that for the corresponding results of standard DKI. Equation 5 applies for all diffusion times and mixing times and a possible dependence of $D_{app}(n)$ and $K_{app}(n)$ on these parameters is implicit.

For standard DKI, it can be argued that $D_{app}(n)$ and $K_{app}(n)$, for water diffusion in open geometries such as the brain, depend only weakly on the pulse duration. It is probable that the same holds true for $\tilde{D}_{app}(\tilde{n})$ and $\tilde{K}_{app}(\tilde{n})$ so that:

$$\tilde{D}_{app}(\tilde{n}) \approx \tilde{D}(\tilde{n}) \text{ and } \tilde{K}_{app}(\tilde{n}) \approx \tilde{K}(\tilde{n}). \quad \text{Equation 6}$$

To quantify anisotropic diffusion, the 6D diffusion tensor, $\tilde{D}$, can be defined by its components:

$$\tilde{D}_{\alpha\beta} \equiv \frac{\langle\tilde{s}_\alpha\tilde{s}_\beta\rangle}{2t}, \quad \text{Equation 7}$$

where the indices (α,β) run from 1 to 6. (Greek subscripts are used for 6D indices to distinguish them from 3D indices, for Latin subscripts are used.) $\tilde{D}$ has a total of 36 components and is symmetric with respect to an interchange of the component indices, so that $\tilde{D}_{\alpha\beta}=\tilde{D}_{\beta\alpha}$. As a consequence of time reversal invariance, D has the additional property:

$$\tilde{D}_{\alpha\beta}=\tilde{D}_{\alpha'\beta'}, \quad \text{Equation 8}$$

where:

$$\alpha'=(\alpha+3)\bmod 6 \text{ and } \beta'=(\beta+3)\bmod 6. \quad \text{Equation 9}$$

The combination of the two symmetries implies that $\tilde{D}$ has only 12 independent components.

Similarly, it is also convenient to define a 6D diffusional kurtosis tensor, $\tilde{W}$, by:

$$\tilde{W}_{\alpha\beta\gamma\delta} \equiv \frac{36}{\langle\tilde{s}\cdot\tilde{s}\rangle^2} \quad \text{Equation 10}$$

$$(\langle\tilde{s}_\alpha\tilde{s}_\beta\tilde{s}_\gamma\tilde{s}_\delta\rangle - \langle\tilde{s}_\alpha\tilde{s}_\beta\rangle\langle\tilde{s}_\gamma\tilde{s}_\delta\rangle - \langle\tilde{s}_\alpha\tilde{s}_\gamma\rangle\langle\tilde{s}_\beta\tilde{s}_\delta\rangle - \langle\tilde{s}_\alpha\tilde{s}_\delta\rangle\langle\tilde{s}_\beta\tilde{s}_\gamma\rangle),$$

which is a direct extension of the definition for the 3D kurtosis tensor. While $\tilde{W}$ has a total of 1296 components, symmetry with respect to interchange of component indices plus time reversal invariance imply that the number of independent components is 66. Time reversal invariance for $\tilde{W}$ can be expressed as $\tilde{W}_{\alpha\beta\gamma\delta}=\tilde{W}_{\alpha'\beta'\gamma'\delta'}$, where γ' and δ' are defined in analogy with α' and β'.

The relationships between the two 6D tensors and the 6D diffusivity and 6D diffusional kurtosis in a specified direction are:

$$\tilde{D}(\tilde{n}) = \sum_{\alpha,\beta=1}^{6} \tilde{D}_{\alpha\beta}\tilde{n}_\alpha\tilde{n}_\beta, \quad \text{Equation 11}$$

and $$\tilde{K}(\tilde{n}) = \left(\frac{\tilde{D}}{\tilde{D}(\tilde{n})}\right)^2 \sum_{\alpha,\beta,\gamma,\delta=1}^{6} \tilde{W}_{\alpha\beta\gamma\delta}\tilde{n}_\alpha\tilde{n}_\beta\tilde{n}_\gamma\tilde{n}_\delta, \quad \text{Equation 12}$$

where $\tilde{n}_\alpha$ represents the components of the direction vector ñ and $\tilde{D}$ is the 6D mean diffusivity (MD), which can be calculated from $$\tilde{D} = \frac{1}{6}\text{tr}(\tilde{D}). \quad \text{Equation 13}$$

Thus, $\tilde{D}$ and $\tilde{W}$ fully characterize the 6D diffusivity and kurtosis. Accordingly, the magnitude unit 34 can use $\tilde{D}$ and/or $\tilde{W}$ to determine the magnitude of the data representing the d-PFG diffusion sequence.

The components of $\tilde{D}$ can be expressed in terms of the conventional 3D diffusion tensor D. Specifically:

$$\tilde{D}(t,\tau) = \begin{pmatrix} D(t) & C(t,\tau) \\ C(t,\tau) & D(t) \end{pmatrix}, \quad \text{Equation 14}$$

where $$C(t,\tau) \equiv \frac{1}{2t}[(2t+\tau)D(2t+\tau) + \tau D(\tau) - 2(t+\tau)D(t+\tau)]. \quad \text{Equation 15}$$

Thus, only the 6D kurtosis tensor $\tilde{W}$ can provide information that is not accessible with s-PFG MRI. Note that the dependence of $\tilde{D}$ on the mixing time τ is entirely through the off-diagonal blocks C, which vanish when D is independent of the diffusion time t. Moreover, from Equation 15, it is evident that C(t,0)=D(2t)−D(t), and since D generally approaches a constant for long diffusion times, that C(t,∞)=0.

From Equations 13 and 14:

$$\tilde{\bar{D}} = \frac{1}{3}\text{tr}(D) = \bar{D}, \quad \text{Equation 16}$$

where $\bar{D}$ is the 3D MD. Thus, the 3D and 6D diffusion tensors always have identical MDs.

While $\tilde{W}$ does provide new information, 15 of its 66 degrees of freedom recapitulate those of the 3D diffusional kurtosis tensor W. In particular, $\tilde{W}_{ijkl}=W_{ijkl}$, for $1 \le i,j,k,l \le 3$, where $W_{ijkl}$ are the components of W.

The estimation of the full 6D kurtosis tensor from d-PFG data by the magnitude unit 34 requires at least 66 diffusion directions. While this is feasible, a simpler data acquisition scheme can be applied for estimating the mean of $\tilde{W}$, by extending to 6D for standard DKI. The mean for W is defined by:

$$\bar{W} \equiv \frac{1}{4\pi}\int d\Omega \sum_{i,j,k,l=1}^{3} W_{ijkl} n_i n_j n_k n_l, \quad \text{Equation 17}$$

where $n_i$ the components of a 3D direction vector, while the mean for $\tilde{W}$ is defined by:

$$\tilde{\bar{W}} \equiv \frac{1}{\pi^3}\int d\tilde{\Omega} \sum_{\alpha,\beta,\gamma,\delta=1}^{6} \tilde{W}_{\alpha\beta\gamma\delta} \tilde{n}_\alpha \tilde{n}_\beta \tilde{n}_\gamma \tilde{n}_\delta. \quad \text{Equation 18}$$

The angular integrals of Equations 17 and 18 are both taken over all directions, in 3D and 6D, respectively. The $\pi^3$ in the normalization factor of Equation 18 is the surface area of a 6D hypersphere of unit radius, just as the 4π in the normalization factor of Equation 17 is the surface area of a 3D sphere of unit radius. Performing the integrals in Equations 17 and 18 yields:

$$\bar{W} = \quad \text{Equation 19}$$

$$\frac{1}{5}(W_{1111} + W_{2222} + W_{3333} + 2W_{1122} + 2W_{1133} + 2W_{2233}),$$

and $$\tilde{\bar{W}} = \quad \text{Equation 20}$$

$$\frac{1}{8}(\tilde{W}_{1111} + \tilde{W}_{2222} + \tilde{W}_{3333} + 2\tilde{W}_{1122} + 2\tilde{W}_{1133} + 2\tilde{W}_{2233} +$$

$$\tilde{W}_{1144} + \tilde{W}_{2255} + \tilde{W}_{3366} +$$

$$2\tilde{W}_{1155} + 2\tilde{W}_{1166} + 2\tilde{W}_{2266}).$$

$\bar{W}$ is strongly correlated with and approximately equal to the more commonly used mean kurtosis (MK) metric. Moreover, $\bar{W}$ can be estimated with only 9 diffusion directions, leading to a highly efficient imaging protocol. Generalizing this method to 6D results in a DP-DKI protocol with 21 directions that is sufficient for estimating $\tilde{\bar{W}}$.

TABLE 1

6D diffusion gradient directions that can be used to measure $\tilde{\bar{W}}$.

| m | $\tilde{n}_m$ |
|---|---|
| 1 | (1, 0, 0, 0, 0, 0) |
| 2 | (0, 1, 0, 0, 0, 0) |
| 3 | (0, 0, 1, 0, 0, 0) |
| 4 | (1, 1, 0, 0, 0, 0)/√2 |
| 5 | (1, −1, 0, 0, 0, 0)/√2 |
| 6 | (1, 0, 1, 0, 0, 0)/√2 |
| 7 | (1, 0, −1, 0, 0, 0)/√2 |
| 8 | (0, 1, 1, 0, 0, 0)/√2 |
| 9 | (0, 1, −1, 0, 0, 0)/√2 |
| 10 | (1, 0, 0, 0, 1, 0)/√2 |
| 11 | (1, 0, 0, 0, −1, 0)/√2 |
| 12 | (1, 0, 0, 0, 0, 1)/√2 |
| 13 | (1, 0, 0, 0, 0, −1)/√2 |
| 14 | (0, 1, 0, 0, 0, 1)/√2 |
| 15 | (0, 1, 0, 0, 0, −1)/√2 |
| 16 | (1, 0, 0, 1, 0, 0)/√2 |
| 17 | (1, 0, 0, −1, 0, 0)/√2 |
| 18 | (0, 1, 0, 1, 0, 0)/√2 |
| 19 | (0, 1, 0, −1, 0, 0)/√2 |
| 20 | (0, 0, 1, 0, 0, 1)/√2 |
| 21 | (0, 0, 1, 0, 0, −1)/√2 |

For example, consider the set of 21 6D directions, $\tilde{n}_m$, listed in Table 1. It will be understood that 6D directions other than those shown in Table 1 can be used. Using the 6D directions listed in Table 1, $$A_m(\tilde{b}) \equiv \ln[\tilde{S}(\tilde{b};\tilde{n}_m)], \quad \text{Equation 21}$$

can be defined.

The following quantities can be constructed based on the definition:

$$\psi(\tilde{b}) \equiv \frac{1}{15}\sum_{m=1}^{3} A_m(\tilde{b}) + \frac{2}{15}\sum_{m=4}^{9} A_m(\tilde{b}). \quad \text{Equation 22}$$

and $$\tilde{\psi}(\tilde{b}) \equiv \frac{1}{12}\sum_{m=4}^{15} A_m(\tilde{b}) + \frac{1}{24}\sum_{m=16}^{21} A_m(\tilde{b}) - \frac{1}{12}\sum_{m=1}^{3} A_m(\tilde{b}). \quad \text{Equation 23}$$

Further analysis leads to the result $$\psi(\tilde{b}) = \ln(\tilde{S}_0) - \tilde{b}\bar{D} + \frac{1}{6}\tilde{b}^2\bar{D}^2\bar{W} + O(\tilde{b}^3), \quad \text{Equation 24}$$

so that $\bar{D}$ and $\bar{W}$ can be estimated from a quadratic fit to ψ as a function of $\tilde{b}$. Extending the analysis to $\tilde{\psi}$ yields $$\tilde{\psi}(\tilde{b}) = \ln(\tilde{S}_0) - \tilde{b}\tilde{\bar{D}} + \frac{1}{6}\tilde{b}^2\tilde{\bar{D}}^2\tilde{\bar{W}} + O(\tilde{b}^3), \quad \text{Equation 25}$$

which shows how the magnitude unit 34 can estimate $\tilde{\bar{D}}$ and $\tilde{\bar{W}}$. This approach avoids the need to explicitly evaluate either the diffusion or kurtosis tensors. Although $\tilde{\bar{D}}=\bar{D}$, generally, $\tilde{\bar{W}} \ne \bar{W}$, with $\tilde{\bar{W}}$ representing new information that cannot be determined from s-PFG experiments alone.

As an example, in order to more clearly understand the meaning of the 6D kurtosis, the magnitude determination unit can receive a d-PFG diffusion sequence that includes a multiple Gaussian compartment model without inter-compartmental water exchange. For this case, the magnitude unit 34 can find:

$$\tilde{K}(\tilde{n}) = 3\frac{\delta^2 \tilde{D}(\tilde{n})}{[\tilde{D}(\tilde{n})]^2},$$ Equation 26 where $\delta^2\tilde{D}(\tilde{n})$ is the variance for the distribution of compartmental diffusivities in the direction $\tilde{n}$. Thus, the 6D kurtosis in a direction $\tilde{n}$ is 3 times the squared coefficient of variation for the 6D compartmental diffusivities. Further:

$$\frac{5}{8}\overline{W} \le \tilde{W} \le \overline{W}.$$ Equation 27

The equality $\tilde{W}=\overline{W}$ only holds if and only if the tensors obtained by subtracting all possible pairs of compartmental diffusion tensors are all isotropic, which is a mathematical statement of an absence of microscopic anisotropy for this class of models. In contrast, the special case $\tilde{W}=5\overline{W}/8$ corresponds to models in which all the compartments have the same mean diffusivity (MD), so that the variance in compartmental diffusivities is entirely due to anisotropy. Broadly speaking, the greater the difference between $\overline{W}$ and $\tilde{W}$, the greater is the degree of microscopic diffusional anisotropy.

For multiple Gaussian compartment models without inter-compartmental water exchange, both W and $\tilde{W}$ are independent of the mixing time $\tau$. For W, this is a general property. However, if water exchange is allowed, then $\tilde{W}$ may depend on $\tau$ through its components that have some indices between 1 and 3 and others between 4 and 6 (e.g., $\tilde{W}_{1246}$). These components can depend on $\tau$, because they link the first and second diffusion blocks. Thus, while $\overline{W}$ is strictly independent of $\tau$, $\tilde{W}$ could change if the mixing time were altered. A difference between $\overline{W}$ and $\tilde{W}$ might therefore reflect water exchange effects as well as microscopic anisotropy, particularly for mixing times long in comparison to inter-compartmental exchange times.

IV. Methods

Figure 4:
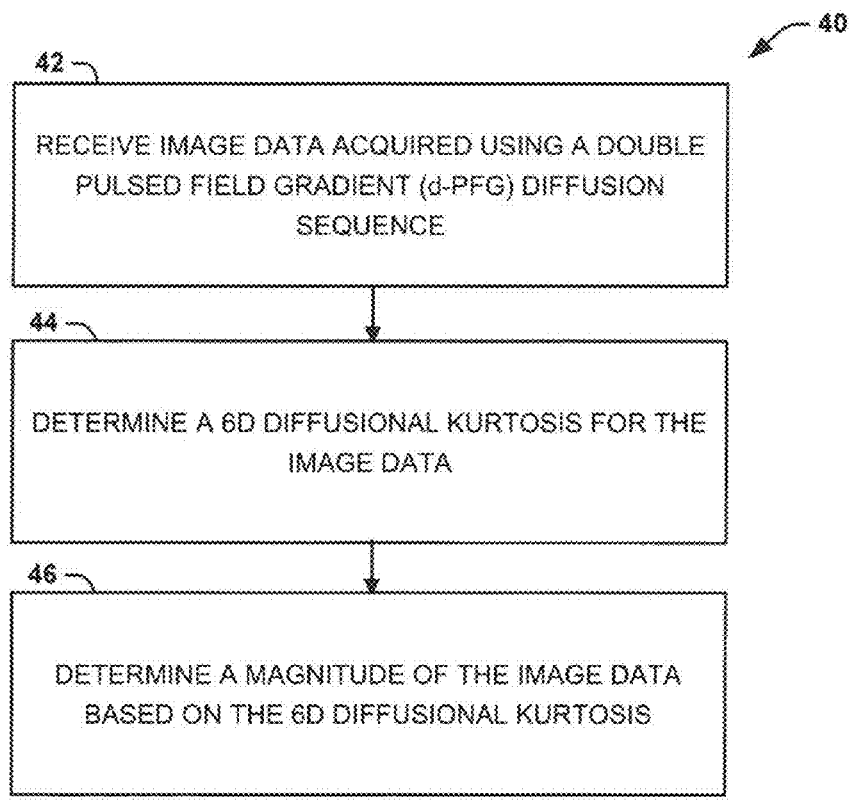
FIG. 4 is a process flow diagram illustrating a method performing DP-DKI in accordance with another aspect of the present disclosure.

Another aspect of the present disclosure can include methods that can perform double pulsed diffusional kurtosis imaging (DP-DKI). An example of a method 40 that can perform DP-DKI is shown in FIG. 4. Another example of a method 50 that can diagnose a medical condition in a subject based on the identification of the FA is shown in FIG. 5.

Figure 5:
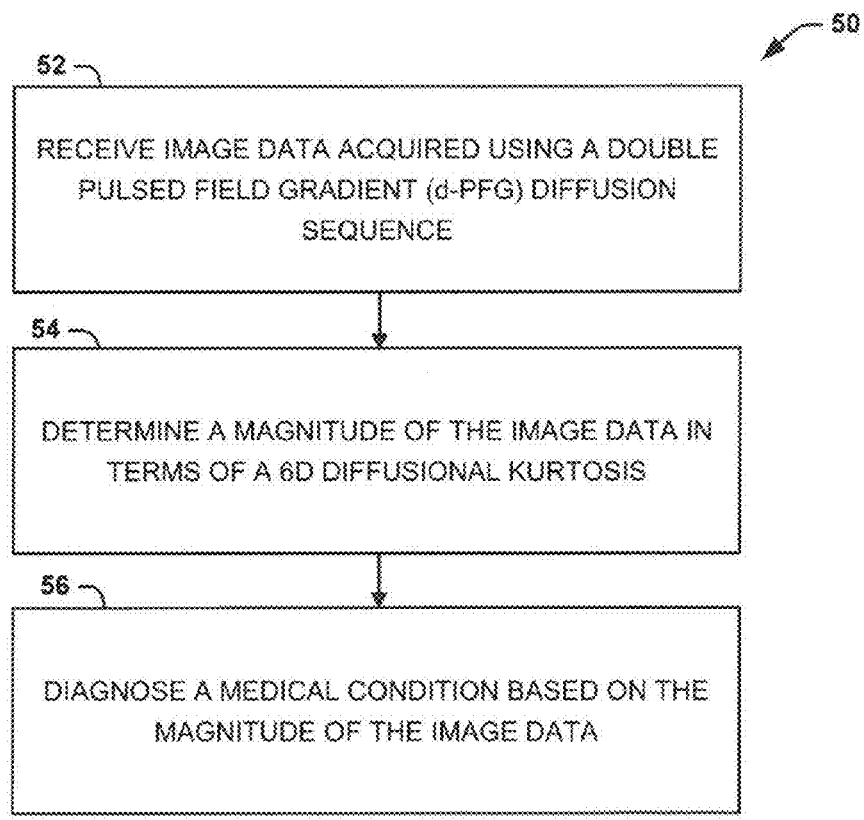
FIG. 5 is a process flow diagram illustrating a method for diagnosing a medical condition in a subject undergoing a magnetic resonance imaging (MRI) procedure based on DP-DKI in accordance with another aspect of the present disclosure.

The methods 40 and 50 of FIGS. 4 and 5, respectively, are illustrated as process flow diagrams with flowchart illustrations. For purposes of simplicity, the methods 40 and 50 are shown and described as being executed serially; however, it is to be understood and appreciated that the present disclosure is not limited by the illustrated order as some steps could occur in different orders and/or concurrently with other steps shown and described herein. Moreover, not all illustrated aspects may be required to implement the methods 40 and 50.

One or more blocks of the respective flowchart illustrations, and combinations of blocks in the block flowchart illustrations, can be implemented by computer program instructions. These computer program instructions can be stored in memory and provided to a processor of a general purpose computer, special purpose computer, and/or other programmable data processing apparatus to produce a machine, such that the instructions, which execute via the processor of the computer and/or other programmable data processing apparatus, create mechanisms for implementing the steps/acts specified in the flowchart blocks and/or the associated description. In other words, the steps/acts can be implemented by a system comprising a processor that can access the computer-executable instructions that are stored in a non-transitory memory.

The methods 40 and 50 of the present disclosure may be embodied in hardware and/or in software (including firmware, resident software, micro-code, etc.). Furthermore, aspects of the present disclosure may take the form of a computer program product on a computer-usable or computer-readable storage medium having computer-usable or computer-readable program code embodied in the medium for use by or in connection with an instruction execution system. A computer-usable or computer-readable medium may be any non-transitory medium that can contain or store the program for use by or in connection with the instruction or execution of a system, apparatus, or device.

Referring to FIG. 4, an aspect of the present disclosure can include a method 40 for performing DP-DKI. For example, a subject can undergo a dMRI imaging study where an image can be obtained of an anatomical structure. For example, the anatomical structure can include at least a portion of the subject's brain. Image data can be received, at 42 (e.g., by receiver 12). The image data can be acquired using a double pulsed field gradient (d-PFG) imaging sequence. In some instances, the image data can reflect 15 or more gradient directions. In other instances, the image data can reflect 18 or more gradient directions. In still other instances, the image data can reflect 21 or more gradient directions.

At 44, a six dimensional (6D) diffusional kurtosis can be determined for the image data (e.g., by 6D unit 32 of the magnitude determination unit 14). At 46, a magnitude of the image data (e.g., by the magnitude unit 34 of the magnitude determination unit 14) based on the 6D diffusional kurtosis (e.g., based on a diffusion displacement probability density function (dPDF)). The 6D diffusional kurtosis can encode information provided by the d-PFG diffusion sequence as a second order diffusion weighting (b-value). The magnitude of the image data can reflect leading diffusion aspects that provide information beyond that which is available from image data recorded with a s-PFG diffusion sequence.

Referring now to FIG. 5, another aspect of the present disclosure can include a method 50 for diagnosing a medical condition of a subject. In some instances, the medical condition can be a neurological disease and/or a neuro-degenerative disease. Examples of such neurological diseases and neuro-degenerative diseases can include stroke, Alzheimer's disease, head trauma, schizophrenia, attention deficit hyperactivity disorder, etc. Steps 52-54 are similar to steps 42-46 of the method 40 illustrated in FIG. 4. For example, at 52, image data acquired using a d-PFG diffusion sequence can be received (e.g., by receiver 12), and at 54, a magnitude of the image data can be determined (e.g., by magnitude determination unit 14) in terms of 6D diffusional kurtosis.

At 56, a medical condition can be diagnosed based on the magnitude of the image data. For example, the diagnosis can be based on a medical standard and/or a comparison to a stored historical data. As another example, the diagnosis can be based on a display of the magnitude of the image data (e.g., an MRI image of the patient's brain with color corresponding to the diffusion). In some instances, the medical condition, which can be already diagnosed, can be evaluated based on the magnitude of the image data. For example, a progress or stage of the medical condition can be evaluated based on the magnitude.

V. Examples

The following examples are for the purpose of illustration only and are not intended to limit the scope of the appended claims.

Example 1

This example illustrates an approach that extends the diffusional kurtosis imaging (DKI) formalism to double pulsed field gradient (d-PFG) diffusion sequences that thereby quantifies the associated non-Gaussian diffusion effects as double pulsed DKI (DP-DKI). To demonstrate DP-DKI, experiments were completed on an in vivo mouse brain (d-PFG diffusion sequences obtained at 7T) and the results presented below.

Methods

Two male C57BL/6 mice (20-25 g) were imaged. All experimental procedures were approved by the Institutional Animal Care and Use Committee of the Medical University of South Carolina. Animals were initially anesthetized with 3% isoflurane and were maintained at 1.5% during MRI experiments. Rectal temperature was maintained at 36.8° C. using air circulation (SA Instruments, Stony Brook, N.Y.) throughout the experiments. Respiratory rate was monitored using a MRI-compatible system (SA Instruments, Stony Brook, N.Y.). All recorded parameters were maintained within normal physiologic ranges.

Both animals were scanned on a 7T Bruker Biospec scanner (Bruker Biospin GmbH, Germany) with a maximum gradient of 445 mT/m. For DP-DKI, diffusion images were acquired with a d-PFG two-shot echo planar imaging sequence (see the sequence diagram in FIG. 2) with the implementation of a navigator echo for correcting Nyquist ghosting, frequency, and phase shifts between shots. Diffusion images were acquired with $b=0, 500, 1000, 1500, 2000, 2500$ s/mm$^2$, using the 21 diffusion directions listed in Table 1. The primary sequence parameters were: TR/TE=3000/49.4 ms, $\delta/t/\tau=5/11/15.2$ ms, matrix=128×128, number of slices=11 (no gap), FOV=20×20 mm$^2$, resolution=0.156× 0.156×0.7 mm$^3$, and bandwidth=250 kHz. Each measurement was performed 4 times for signal averaging, except for the $\tilde{b}=0$ measurement which was performed 20 times, resulting in a total acquisition time of 44 minutes.

For qualitative comparison, a dataset using a standard s-PFG DKI protocol was also obtained. The imaging sequence parameters for standard DKI were identical to those for DP-DKI, except that 30 diffusion-encoding directions were used together with the 3 b-values of 0, 1000 and 2000 s/mm$^2$, for a total acquisition time of 33 minutes.

The DP-DKI data was analyzed with the help of Equations 24 and 25, with $\overline{D}, \tilde{\overline{D}}, \overline{W}$, and $\tilde{\overline{W}}$ being estimated from fits to these quadratic functions of the b-value. The coefficients for the fits were determined by using linear least squares. The standard DKI data was processed with freely available in-house software, Diffusional Kurtosis Estimator, available at http://www.nitrc.org/projects/dke, and included calculation of parametric maps for the mean diffusivity (MD), mean kurtosis (MK), and fractional anisotropy (FA).

It may be noted that $\overline{D}$ and $\overline{W}$, as calculated with Equation 24, utilize only the first 9 directions listed in Table 1. For this subset of directions, the amplitudes of the second block of diffusion gradients are zero. As a consequence, one could regard these as s-PFG measurements, even though the data were obtained with a nominal d-PFG sequence.

Results

Figure 6:
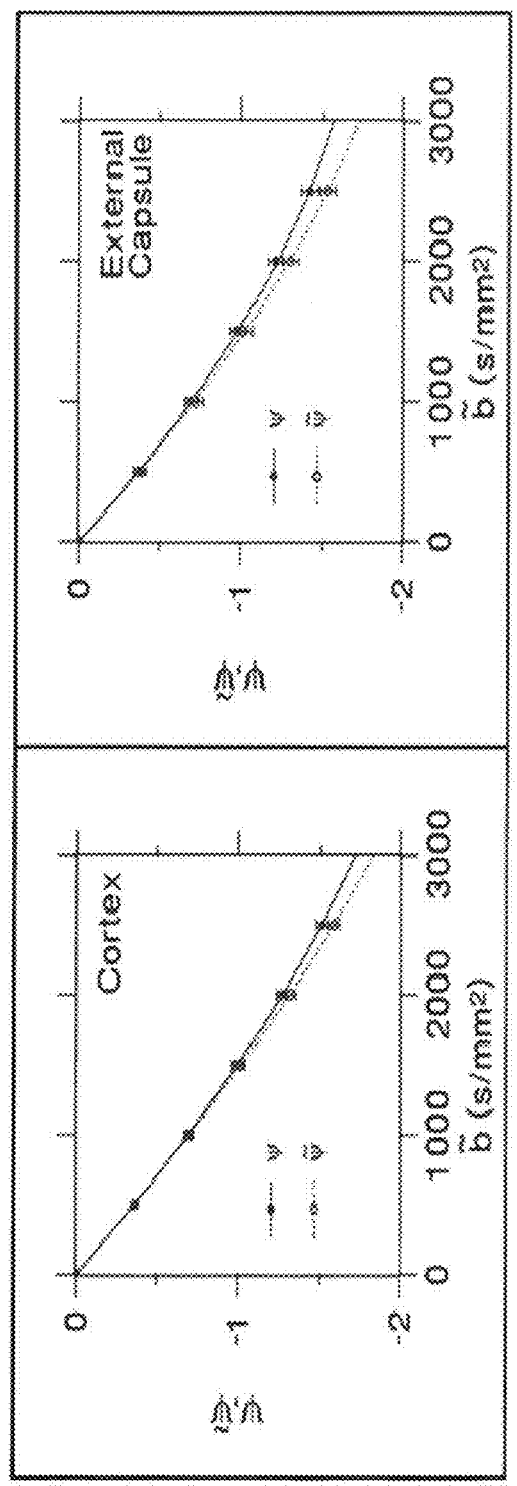
FIG. 6 shows example plots of $\psi(\tilde{b})$ and $\bar{\psi}(\tilde{b})$ calculated for the cortex and external capsule of a single mouse brain.

Plots of $\psi$ and $\tilde{\psi}$ as functions of $\tilde{b}$ shown in FIG. 6 for the cortex and external capsule of one animal, with the error bars indicating standard deviations over the regions of interest. Also shown are the quadratic fits to the data, which may be used for estimating $\overline{D}, \tilde{\overline{D}}, \overline{W}$, and $\tilde{\overline{W}}$. The regions of interest contain 490 and 78 voxels for the cortex and external capsule, respectively. The plots for $\psi$ are more nonlinear than for $\tilde{\psi}$, indicating that $\overline{W}$ is greater than $\tilde{\overline{W}}$.

Figure 7:
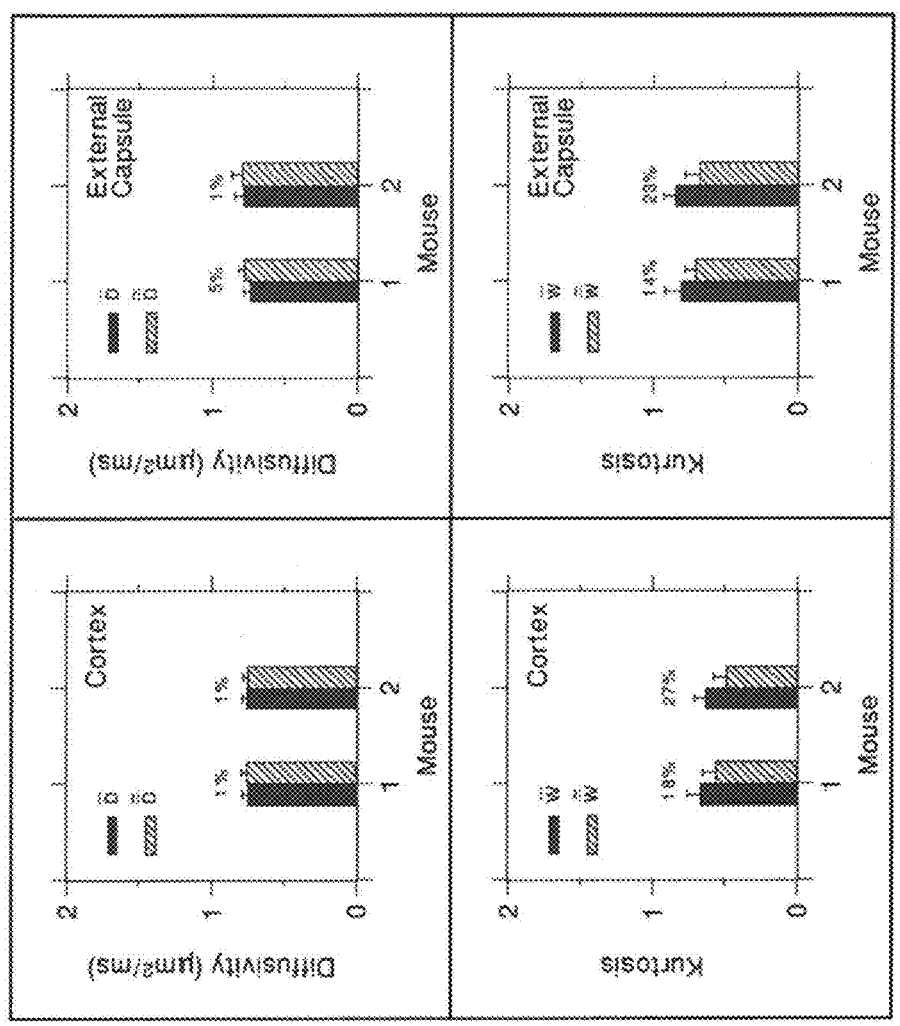
FIG. 7 shows example results for diffusivities ($\bar{D}$ and $\tilde{D}$) and kurtoses ($\bar{W}$ and $\tilde{\bar{W}}$) in the cortex and external capsule for two mice.

Region of interest results for $\overline{D}, \tilde{\overline{D}}, \overline{W}$, and $\tilde{\overline{W}}$ are plotted in FIG. 7 for the two mice. Fits to Equations 24 and 25 were performed on a voxel-by-voxel basis, and mean values were obtained by averaging over the regions. The error bars indicate standard deviations. Notice that there is little difference between $\overline{D}$ and $\tilde{\overline{D}}$, consistent with Equation 16. In contrast, $\tilde{\overline{W}}$ is substantially lower than $\overline{W}$, suggesting appreciable microscopic diffusional anisotropy. In all cases, the differences between $\overline{W}$ and $\tilde{\overline{W}}$ are highly statistically significant (t-test, $p<0.0001$). The regions of interest for the cortex had 510 and 490 voxels, while the regions of interest for the external capsule had 50 and 78 voxels.

Figure 8:
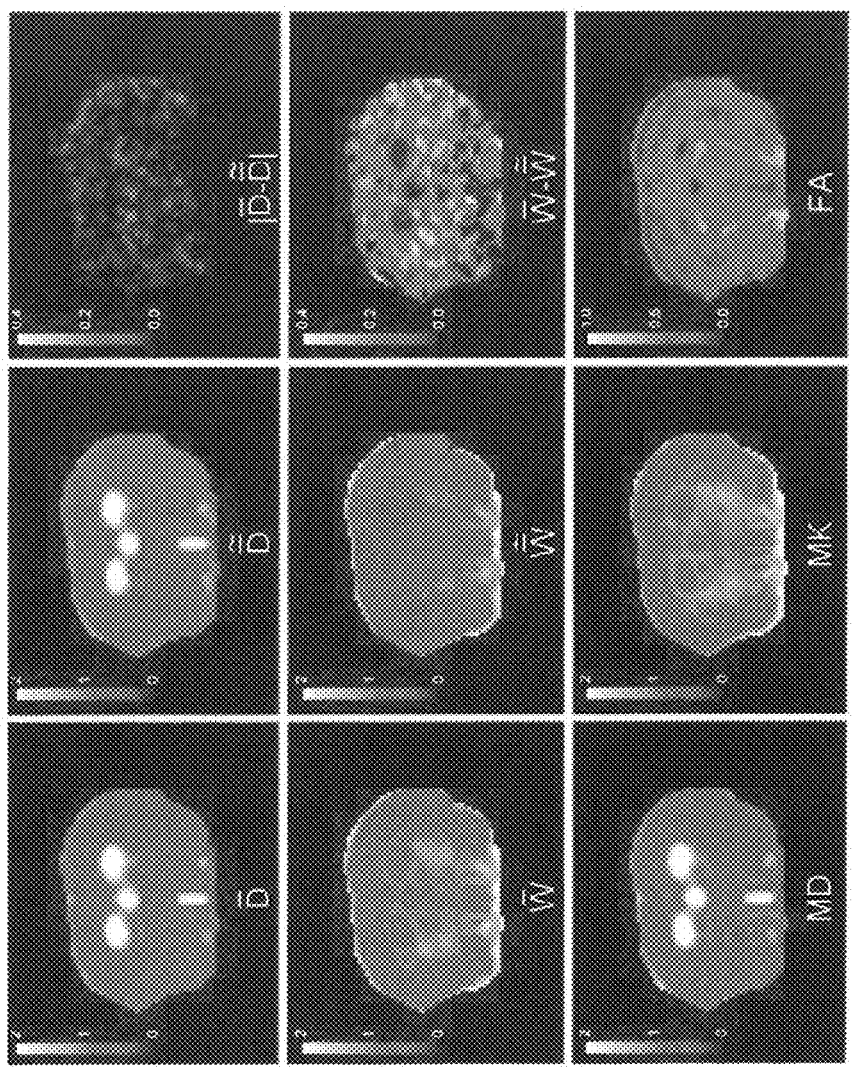
FIG. 8 shows example maps obtained with DP-DKI for one brain slice of a single mouse.

Parametric maps for $\overline{D}, \tilde{\overline{D}}, \overline{W}$, and $\tilde{\overline{W}}$ are given by FIG. 8 for a single slice from one animal. Also shown are the difference maps $|\overline{D}-\tilde{\overline{D}}|$ and $\overline{W}-\tilde{\overline{W}}$. The absolute difference is used for the diffusivities, since their differences are close to zero. As a reference for comparison, the standard s-PFG DKI maps for mean diffusivity (MD), mean kurtosis (MK), and fractional anisotropy (FA) appear in the bottom row. Note that the $\overline{D}$ and $\tilde{\overline{D}}$ maps are nearly identical, as expected from Equation 16, and that the standard MD map is also very similar, reflecting the fact that it represents an alternative measurement of the same diffusion metric. However, $\overline{W}$ and $\tilde{\overline{W}}$ are markedly different, as the $\overline{W}-\tilde{\overline{W}}$ map makes evident, with $\overline{W} \geq \tilde{\overline{W}}$ in the vast majority of voxels. This difference between $\overline{W}$ and $\tilde{\overline{W}}$ suggests the presence of microscopic diffusional anisotropy. This is a distinct concept from the more familiar macroscopic diffusional anisotropy quantified by the FA map, for which the pattern of contrast is very different. The standard MK map is similar, but not identical, to the $\overline{W}$ map, as expected from the fact that different b-value ranges were used for estimating these two parameters.

From the above description, those skilled in the art will perceive improvements, changes and modifications. Such improvements, changes and modifications are within the skill of one in the art and are intended to be covered by the appended claims.

What is claimed is:

1. A system that performs double pulsed diffusional kurtosis imaging (DP-DKI), the system comprising:
   a non-transitory memory storing computer-executable instructions; and
   a processor that executes the computer-executable instructions to at least:
   receive image data, wherein the image data was acquired using a double pulsed field gradient (d-PFG) diffusion sequence;
   determine a six dimensional (6D) diffusional kurtosis for the image data; and
   determine a magnitude of the image data based on the 6D diffusional kurtosis.

2. The system of claim 1, wherein the processor further executes the computer-executable instructions to determine a 6D diffusivity for the image data.

3. The system of claim 2, wherein the magnitude of the image data is further based on the 6D diffusivity.

4. The system of claim 3, wherein a natural log of the magnitude of the image data, $\tilde{S}(\tilde{b},\tilde{n})$, is expressed as:

$$\ln[\tilde{S}(\tilde{b},\tilde{n})] = \ln(\tilde{S}_0) - \tilde{b}\tilde{D}_{app}(\tilde{n}) + \frac{1}{6}[\tilde{b}\tilde{D}_{app}(\tilde{n})]^2 \tilde{K}_{app}(\tilde{n}) + O(\tilde{b}^3),$$

where $\tilde{D}_{app}(\tilde{n})$ is the apparent 6D diffusivity and $\tilde{K}_{app}(\tilde{n})$ is the apparent 6D diffusional kurtosis for the direction $\tilde{n}$.

5. The system of claim 1, wherein the magnitude of the image data provides information beyond that which is available from image data recorded using a single pulsed field gradient (s-PFG) diffusion sequence.

6. The system of claim 1, wherein the 6D diffusional kurtosis is determined based on a diffusion displacement probability density function (dPDF).

7. The system of claim 1, wherein the image data comprises a wave-vector pair (q, q'); and
wherein the processor executes the computer-executable instructions to represent the wave-vector pair (q, q') as a 6D wave vector($\tilde{q}$), where the first three components of $\tilde{q}$ correspond to q and the second three components of $\tilde{q}$ correspond to q'.

8. The system of claim 1, wherein the image data is recorded from a subject undergoing a diffusional magnetic resonance imaging (dMRI) procedure.

9. The system of claim 8, wherein the processor further executes the computer-executable instructions to determine a medical condition of the subject based on the magnitude of the image data.

10. A method for performing double pulsed diffusional kurtosis imaging (DP-DKI), the method comprising the steps of:
receiving, by a system comprising a processor, image data acquired using a double pulsed field gradient (d-PFG) diffusion sequence, wherein the image data is recorded from a subject undergoing a magnetic resonance imaging (MRI) procedure;
storing, by the system, the image data in a non-transitory memory;
determining, by the system, a six dimensional (6D) diffusional kurtosis for the image data retrieved from the non-transitory memory;
storing the 6D diffusion kurtosis for the image data in the non-transitory memory;
determining, by the system, a magnitude of the image data based on a the 6D diffusional kurtosis retrieved from the non-transitory memory; and
storing, by the system, the magnitude of the image data in the non-transitory memory, wherein the magnitude of the image data is used to enhance the image taken during the MRI procedure.

11. The method of claim 10, further comprising determining, by the system, a 6D diffusivity for the image data.

12. The method of claim 11, wherein the magnitude of the image data is determined further based on the 6D diffusivity.

13. The method of claim 10, wherein the magnitude of the image data provides information beyond that which is available from image data recorded using a single pulsed field gradient (s-PFG) diffusion sequence.

14. The method of claim 10, wherein the 6D diffusional kurtosis is determined based on a diffusion displacement probability density function (dPDF).

15. The method of claim 10, wherein the data representing the d-PFG diffusion sequence comprises a wave-vector pair (q, q'); and
wherein the processor executes the computer-executable instructions to represent the wave-vector pair (q, q') as a 6D wave vector ($\tilde{q}$), where the first three components of $\tilde{q}$ correspond to q and the second three components of $\tilde{q}$ correspond to q'.

16. The method of claim 15, wherein the magnitude of the image data indicates a microscopic diffusional anisotropy.

17. The method of claim 10, further comprising determining, by the system, a medical condition of the subject based on the magnitude of the image data.

18. A method for diagnosing a medical condition of a subject, the method comprising the steps of:
receiving, by a system comprising a processor, image data acquired using a double pulsed field gradient (d-PFG) diffusion sequence from the subject undergoing a magnetic resonance imaging (MRI) procedure;
storing, by the system, the image data in a non-transitory memory;
determining, by the system, a magnitude of the image data, retrieved from the non-transitory memory, in terms of a six dimensional (6D) diffusional kurtosis;
storing, by the system, the magnitude of the image data in the non-transitory memory; and
diagnosing, by the system, the medical condition of the subject based on the magnitude of the image data retrieved from the non-transitory memory.

19. The method of claim 18, wherein the medical condition is at least one of a neurological disease and a neurodegenerative disease.

20. The method of claim 10, further comprising displaying, by the system on a graphical user interface (GUI), an MRI image taken during the MRI procedure enhanced by the determined magnitude.

* * * * *